United States Patent [19]
Dittrich

[11] Patent Number: 5,548,210
[45] Date of Patent: Aug. 20, 1996

[54] SYSTEM AND PROCEDURE FOR THE CHECK-UP SOLENOID VALVES

[76] Inventor: Ehrenfried Dittrich, Raiffeisenstr. 12, 73035 Goppingen, Germany

[21] Appl. No.: 245,496
[22] Filed: May 18, 1994

[30] Foreign Application Priority Data

May 21, 1993 [DE] Germany .......................... 43 17 109.5

[51] Int. Cl.$^6$ .................................................. G01R 31/02
[52] U.S. Cl. ........................ 324/158.1; 73/168; 324/418
[58] Field of Search .................................. 324/112, 418, 324/158.1, 546; 73/168

[56] References Cited

U.S. PATENT DOCUMENTS

| 3,662,380 | 5/1972 | Cargile | 324/112 |
| 5,153,522 | 10/1992 | Sano | 324/418 |
| 5,243,296 | 9/1993 | Ando et al. | 324/546 |

FOREIGN PATENT DOCUMENTS

3807278A1  3/1988  Germany.

Primary Examiner—Ernest F. Karlsen
Assistant Examiner—Russell M. Kobert
Attorney, Agent, or Firm—Plante & Strauss

[57] ABSTRACT

The invention refers to a system for the technical safety check of solenoid valves, where during an operational switch of the solenoid valve, the induction current of the actuating magnet of the valve is recorded over time and stored as test function $I=I(t)$. From the test function the control function $I'=dI/dt$ is digitally calculated and after digital logarithmation also stored. Both functions may be displayed and evaluated simultaneously on the screen, which assures a better and more exact evaluation of the functional condition of the concerning solenoid valve, including any existing defects.

11 Claims, 3 Drawing Sheets

SYSTEM AND PROCEDURE FOR THE CHECK-UP SOLENOID VALVES

BACKGROUND OF THE INVENTION

1. Field of Invention

The invention relates to a system for the technical safety check of solenoid valves. It also concerns the test equipment for the performance of such procedures.

2. Description of Related Prior Art

According to the German Publication DE 38 07 278 A1, during the technical safety check of solenoid valves, the changes of the induction current over time (I'=dI/dt) are recorded and stored. By caparison of two sequential tests, it is possible to evaluate the functional condition of the respective solenoid valve.

The disadvantage herewith is the intricacy of an automated recording of I'=dI/dt, which is herein referred to as the control function.

The task of the invention, therefore, is to create a system for the technological safety test of solenoid valves and a corresponding test equipment which facilitates the evaluation of the functional condition of solenoid valves.

SUMMARY OF THE INVENTION

According to the invention, testing of solenoid valves is performed by recording the induction current of the actuating magnet of the valve over the time as a test function, I=I(t), saving it digitally and indicating it if necessary. The control function, I'=dI/dt, is then digitally produced from the test function, and after digital logarithmation, it is digitally saved and, if necessary, indicated.

A preferred test equipment for the performance of the test method of the invention comprises a test resistance which is placed in a connecting cable between the voltage source and the actuating magnet of the solenoid. Leads connected across the resistance are connected to input terminals of an amplifier, and the amplifier output is connected through an analog-to-digital transformer to a microprocessor for interim data recording. The test data are transmitted to a test calculator for data storage and the processed data are sent to a display device for display.

BRIEF DESCRIPTION OF THE DRAWINGS

The invention will be described with reference to the figures, of which.

DETAILED DESCRIPTION OF THE PREFERRED EMBODIMENT

Figure 1:
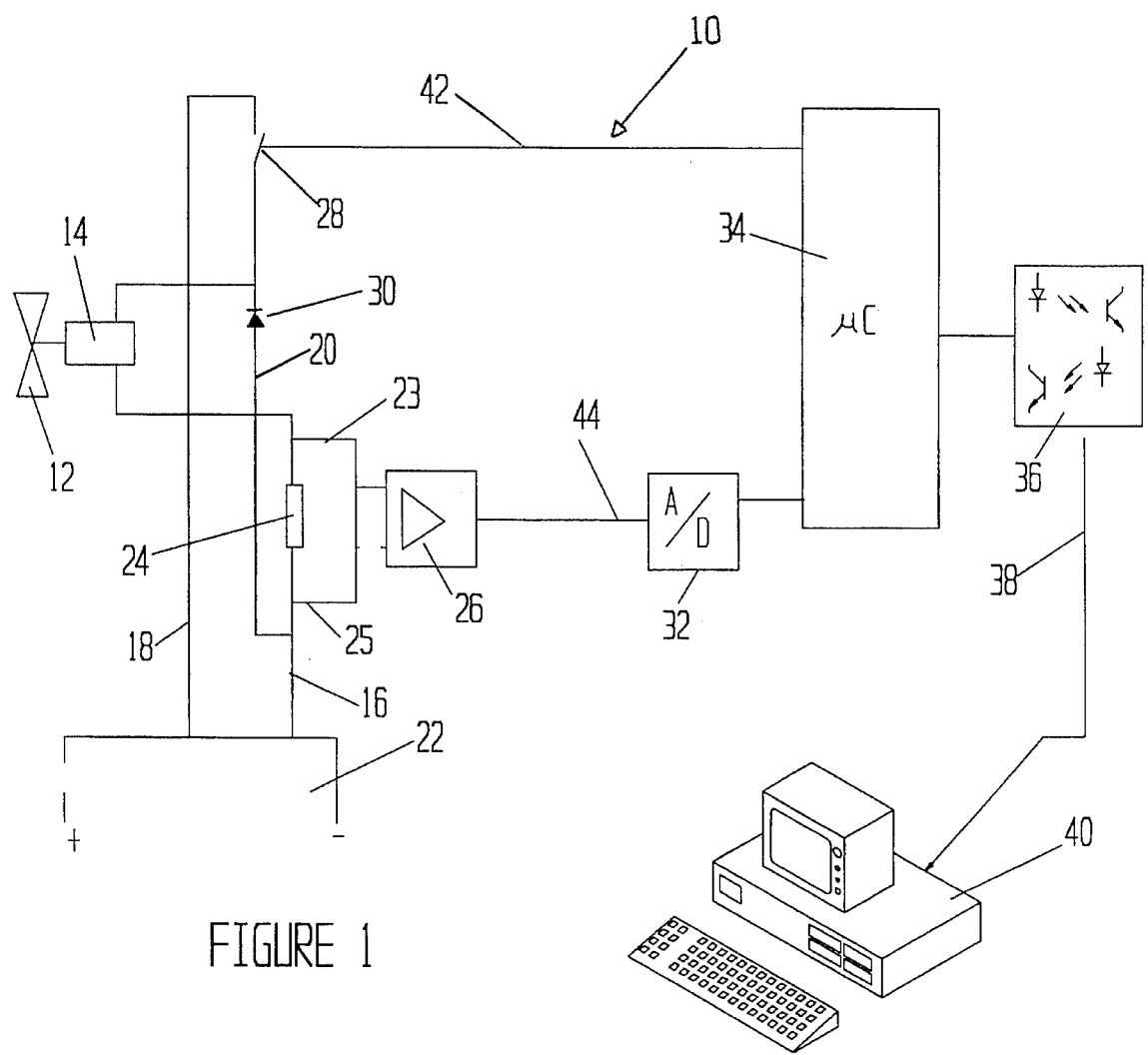
FIG. 1 is an electrical schematic of the test equipment installed according to the invention.

FIG. 1 is the schematic diagram of the test circuit 10 for the technical safety check of a solenoid valve 12 having an actuating magnet 14. The magnet 14 is connected by cables 16, 18 and 20 to a voltage source 22.

A test resistance 24 is located in cable 16 and leads 23 and 25 are connected across the resistance 24 to the input terminals of amplifier 26, which is parallel switched. A switch 28 is located in cable 18 to turn the actuating magnet 14 on and off.

Cable 20 connects between cables 16 and 18 from a point between the test resistance 24 and voltage source 22 to a point between switch 28 and magnet 14. A diode 30 is placed in cable 20 which is switched in such a way between cables 16 and 18 from the current supply 22, that after turning on switch 28, a circuit occurs consisting of voltage source 22, the actuating magnet 14, and the diode 30 in parallel with the test resistance 24.

The output signal of the amplifier 26 is connected by cable 44 to the input of an analog-to-digital converter 32, and the digital signal output from the converter is connected to microprocessor 34.

The microprocessor 34 is connected via a photoisolation circuit 36 and cable 38 to a test calculator 40, which may be any commercial personal computer equipped with a monitor.

In FIG. 1 the switch 28 is in open position. The position of the switch is controlled by microprocessor 34 through cable 42, which opens and closes the solenoid valve 12.

The suitable size of the test resistance 24 for the respective actuating magnet 14 is determined from the magnet data in which the resistance value of the test resistance 24 may amount to up to 2 percent of the resistance of the actuating magnet 14.

When switch 28 is closed, the actuating magnet 14 is connected to the voltage source 22 and the inductive current flowing through the test resistance 24 causes a voltage decline in the latter, which is amplified by amplifier 26 and digitized by the analog-to-digital converter 32 and passed to the microprocessor 34, where the digital signal is interim stored over time. The test data are then transmitted from the microprocessor 34 by the photoisolation circuit 36 to the test calculator 40. The calculator 40 determines and stores the test function I=I(t) from the test data. The test function I=I(t) may be displayed on the screen of the test calculator 40.

When switch 28 is opened, the current now flows through the test resistance 24 and the diode 26. The registration of the test function I=I(t) occurs now in the above-described sequence.

The control of the test is performed by the microprocessor 34, which is turn is controlled by the test calculator 40.

The mathematical, digital evaluation of the test function [I=I(t)], and production of the control function [I'=dI/dt], can follow immediately after transmitting the test data to the test calculator 40. The calculator 40 also performs digital logarithmation of the control function, which can be stored on a diskette or hard disk, or which can be calculated at the time needed from the test function.

Figure 2:
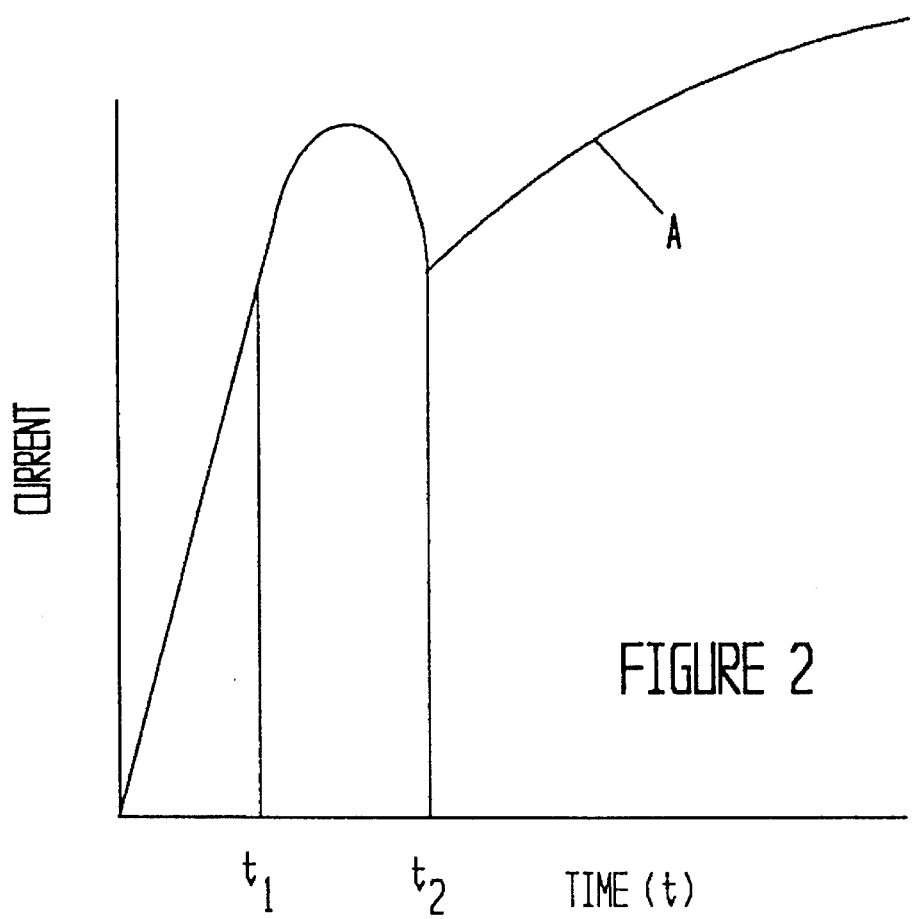
FIG. 2 shows the test function curve, I=I(t).

FIG. 2 demonstrates the curve A of the test function I=I(t) which is plotted with current (I) on the ordinate, and time (t) on the abscissa. The values for the test function are obtained when the current flowing to the actuating magnet is monitored with the test setup according to the invention. The time $t_1$ is called operation delay, and it indicates the moment when the magnet anchor of the actuating magnet starts to move. The motion of the magnet anchor is terminated after the time $t_2$. The difference of these times, $(t_2-t_1)$ represents the stroke time. The operation upon opening of switch 28 may be described in a similar manner.

In the test function I=I(t), however, the time at which the magnet anchor starts to move (operation delay $t_1$) cannot be clearly recognized, and this is apparent from the smooth curve A.

Figure 3:
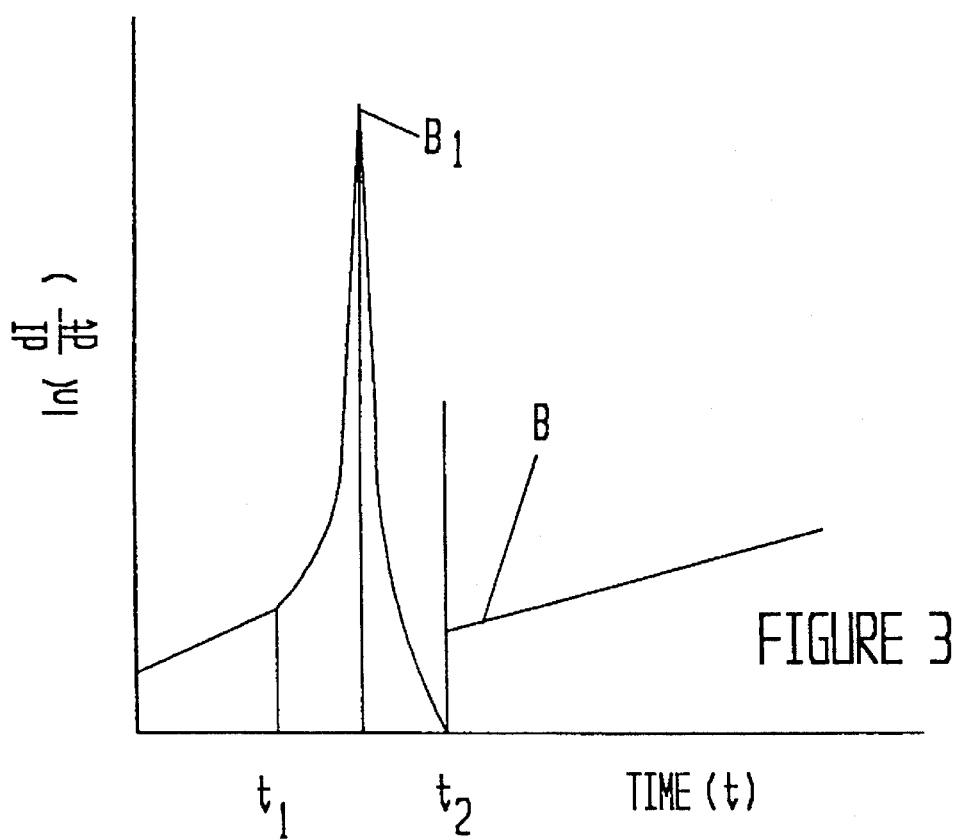
FIG. 3 shows the logarithmical control function curve, I=ln (dI/dt).

In FIG. 3, however, which shows the curve B of the logarithmic control function [I'=ln(dI/dt)], the operation delay $t_1$ is clearly distinguished by the fact that the curve B abruptly discontinues its almost linear course. The stop time $t_2$ can be seen from the last tip $B^1$ of the curve B. All tips represent zero values of the control function I'=dI/dt.

Figure 4:
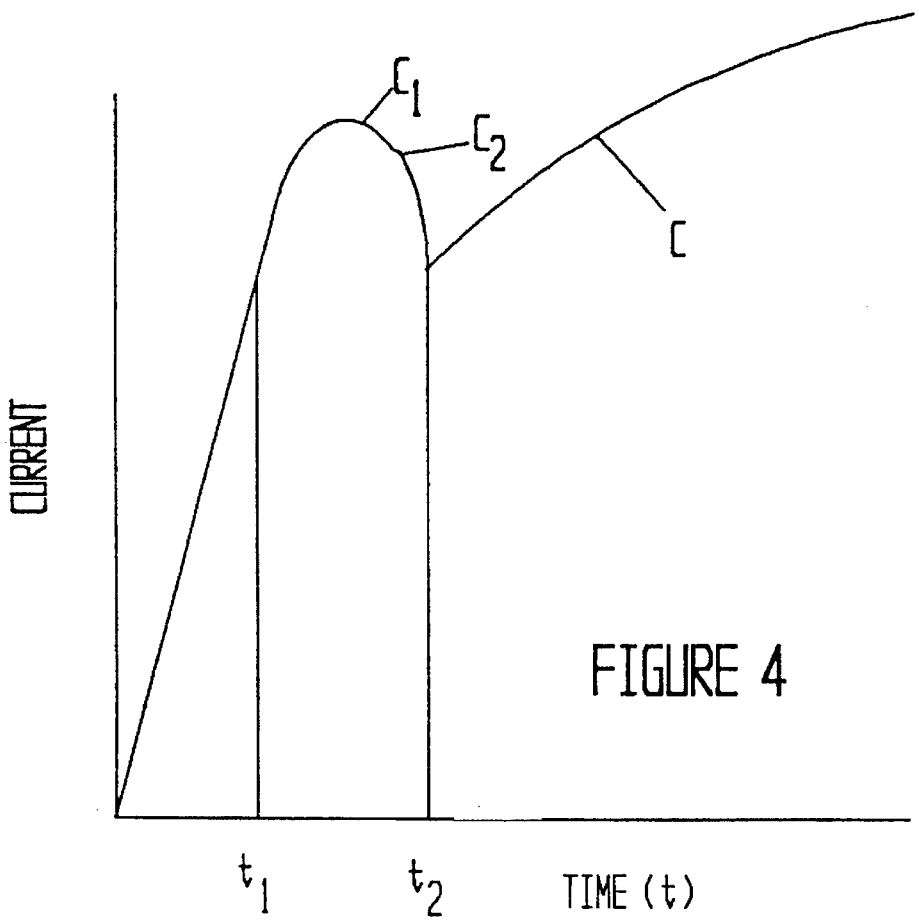
FIGS. 4 and 5 show the test function curve and the logarithmical control function curve for a valve which exists a jolt during the stroke which may be caused by locally increased friction.
Figure 5:
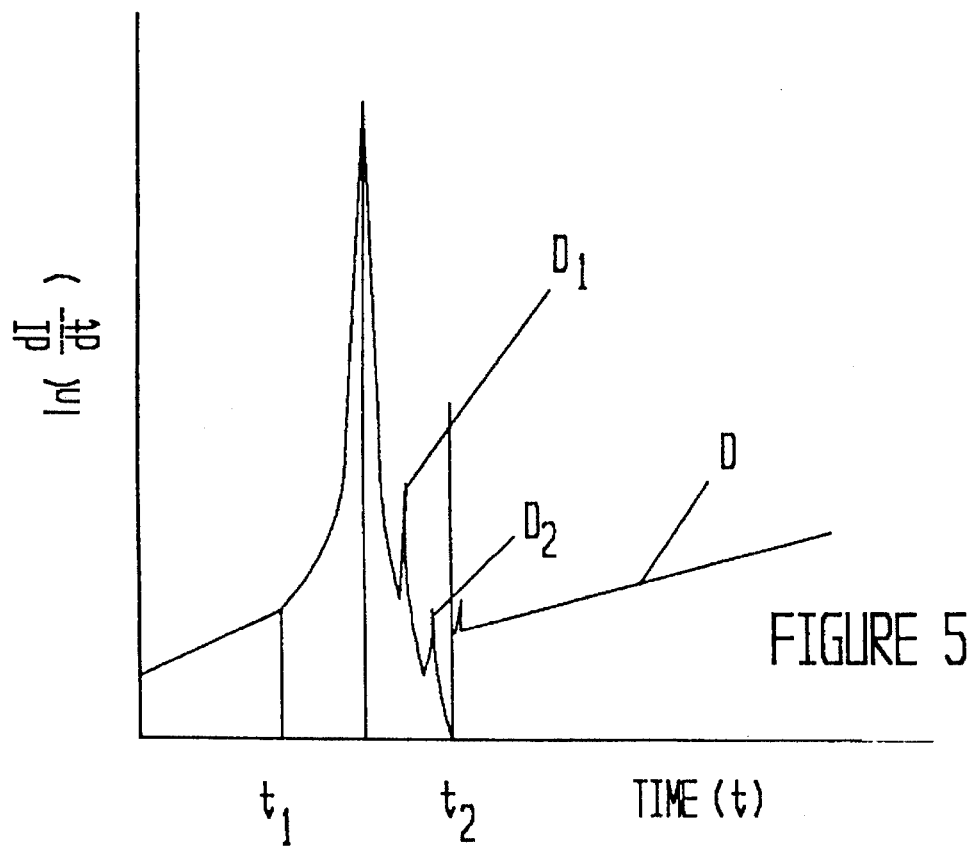

FIGS. 4 and 5 show the test function [I=I(t)] and the logarithmic control function [I'=ln(dI/dt)] for a valve which shows a jolt during the stroke, possibly caused by a locally increased friction.

In FIG. 4, the curve C of the test function [I=I(t)], the jolts are hardly visible, detectible only by two slight waves, C1 and C2 in curve C. In contrast, the curve of the logarithmic control function [I'=ln(dI/dt)] in FIG. 5 demonstrates this clearly by two more tips $D_1$ and $D_2$ of curve D, (compared to FIG. 3). These jolts are cause by increased friction which may, for example, be deposits or corrosion in the valve 12.

The advantage of the test system of the invention is that an automated reception of the induction current is much simpler than an automated reception of the control function. The maximum induction current and with it also the power ranges of the electric components necessary for the reception of the induction current can be determined from the solenoid magnet data and automatically and exactly determined by a test measurement, In contrast, several tests are necessary in the selection of the electronic components for an electric-inductive measurement.

Another advantage is that by the simultaneous display of the test function [I=I(t)] and the logrithamtic control function [Ln dI/dt] on one screen, several characteristics of a solenoid valve may be recognized, such as: start of motion, start up and decay delay, end of motion, and stroke start, and decay time, current values at start of motion, start-up and decay currents, and the course of the motion of the magnet anchor of the valve during the stroke.

With the knowledge of these characteristics, fast and easy statements can be made about the functional condition and the interpretation of a solenoid valve.

The beginning of the mechanical motion can be determined from the logarithmic control function, as the logarithmic control function initially shows an almost linear course with time. The discontinuance of the linear course with time indicates the start of the mechanical movement in the valve. If the delay time ($t_1$) is known, the current value at the start of the movement can be determined from the current curve I=I(t).

The end of the movement and the course of the movement of the magnet anchor during the stroke can be seen from both curves.

Since the mechanical switching process is easier to be detected in the course of the current I=I(t) than in the logarithmic control function I'=dI/dt, the cause of a defect may also be detected from the course of both of the curves.

Because of the direct storage of the test function I=I(t), opposed to the conventional methods, it is now possible to perform random analysis of the test function.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. The method to determine the operational solenoid valve having an actuating magnet for mechanical movement of the valve between open and closed positions, which comprises:

a. measuring the inductive current of the actuating magnet over the time period of movement of the valve between open and closed positions;

b. determining the control function of the valve as the differential of the measured current to the time of measurement and determining the logarithmic value of the control function; and c. determining the starting time of mechanical movement of the valve by determining the time when the logarithmic values of the control function depart from linearity; and d. determining the stopping time of the mechanical movement of said valve and determining the stroke time of mechanical movement as the difference between the starting and stopping time.

2. The method of claim 1 including the step of observing the changes in logarithmic values of the control function with time to determine the presence of abrupt changes generated by abnormal valve performance.

3. The method of claim 1 including the steps of recording values of the inductive current and time during valve movement.

4. The method of claim 1 including the steps of recording the values of the control function of the valve.

5. The method of claim 1 including the steps of recording the logarithmic values of the control function of the valve.

6. The method of claim 1 including the steps of plotting the control function of the valve against time.

7. The method of claim 1 including the steps of displaying the chart of the control values of the valve against time.

8. Testing equipment to evaluate the performance of a solenoid valve having a electromagnetic actuator for moving the valve between open and closed positions which is connected by power supply leads to a power supply with a switch in said leads to apply and remove the power supply to the coil of said electromagnet which comprises:

a. a test lead resistance in one of said power supply leads and a second circuit with a diode in parallel thereto;

b. an amplifier having first and second input connectors connected across the terminals of said lead resistance;

c. an analog-to-digital convertor having its input coupled to the output terminal of said amplifier;

d. a microprocessor having an input terminal coupled to said convertor; and e. calculating means coupled to the output of said microprocessor to determine the test function, the control function and the logarithmic control function of the solenoid valve.

9. The equipment of claim 8 including a display device coupled to said calculating means for the visual display of the control function and logarithmic control function of said solenoid valve.

10. The equipment of claim 9 wherein said display device is a computer monitor.

11. The equipment of claim 8 including data storage means coupled to said microprocessor to record and store test data.

* * * * *